(12) United States Patent
Cho et al.

(10) Patent No.: US 11,972,703 B2
(45) Date of Patent: Apr. 30, 2024

(54) FOLDABLE DISPLAY DEVICE INCLUDING RIGID SUPPORT MEMBER

(71) Applicant: Samsung Display Co., LTD., Yongin-si (KR)

(72) Inventors: Hyunjun Cho, Seoul (KR); Kyu Young Kim, Suwon-si (KR); Yong-Kwan Kim, Yongin-si (KR); Hansun Ryou, Seoul (KR); Yonghyuck Lee, Cheonan-si (KR); Hongkwan Lee, Yongin-si (KR); Sohra Han, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 138 days.

(21) Appl. No.: 17/395,557

(22) Filed: Aug. 6, 2021

(65) Prior Publication Data

US 2022/0198964 A1 Jun. 23, 2022

(30) Foreign Application Priority Data

Dec. 22, 2020 (KR) .......................... 10-2020-0181054

(51) Int. Cl.
  *G09F 9/30* (2006.01)
  *G06F 1/16* (2006.01)
  *H10K 50/844* (2023.01)
  *H10K 102/00* (2023.01)

(52) U.S. Cl.
  CPC ........... *G09F 9/301* (2013.01); *H10K 50/844* (2023.02); *H10K 2102/311* (2023.02)

(58) Field of Classification Search
  CPC .................. G09F 9/301; H10K 50/844; H10K 2102/311; H10K 77/111; H10K 50/84; G06F 1/1641; G06F 1/1652; G06F 1/1637
  See application file for complete search history.

(56) References Cited

U.S. PATENT DOCUMENTS

| 10,268,238 B2 | 4/2019 | Hamburgen et al. |
| 10,579,105 B2 | 3/2020 | Jones et al. |
| 2015/0330614 A1* | 11/2015 | Lee .......................... B65D 85/38 206/45.23 |
| 2016/0150657 A1* | 5/2016 | Myeong ................. G06F 1/1652 361/749 |
| 2019/0302850 A1* | 10/2019 | Park ....................... G06F 1/1616 |

(Continued)

FOREIGN PATENT DOCUMENTS

| KR | 1020190003257 A | 1/2019 |
| KR | 1020200002576 A | 1/2020 |
| KR | 1020200083768 A | 7/2020 |

*Primary Examiner* — Tracie Y Green
(74) *Attorney, Agent, or Firm* — CANTOR COLBURN LLP

(57) ABSTRACT

A foldable display device includes a display module including a first non-folding portion, a second non-folding portion, and a first folding portion between the first non-folding portion and the second non-folding portion, a first support member on a lower surface of the display module, the first support member including a first support portion supporting the first non-folding portion, a second support portion supporting the second non-folding portion, and a first opening pattern overlapping the first folding portion, and including a glass material, and a second support member under the first support member and supporting the display module.

17 Claims, 14 Drawing Sheets

(56) References Cited

U.S. PATENT DOCUMENTS

2020/0209925 A1\* 7/2020 Paek ................. G06F 1/1652
2021/0118337 A1\* 4/2021 Park ................. G09F 9/301
2021/0200381 A1\* 7/2021 Kang ................ H10K 50/844

\* cited by examiner

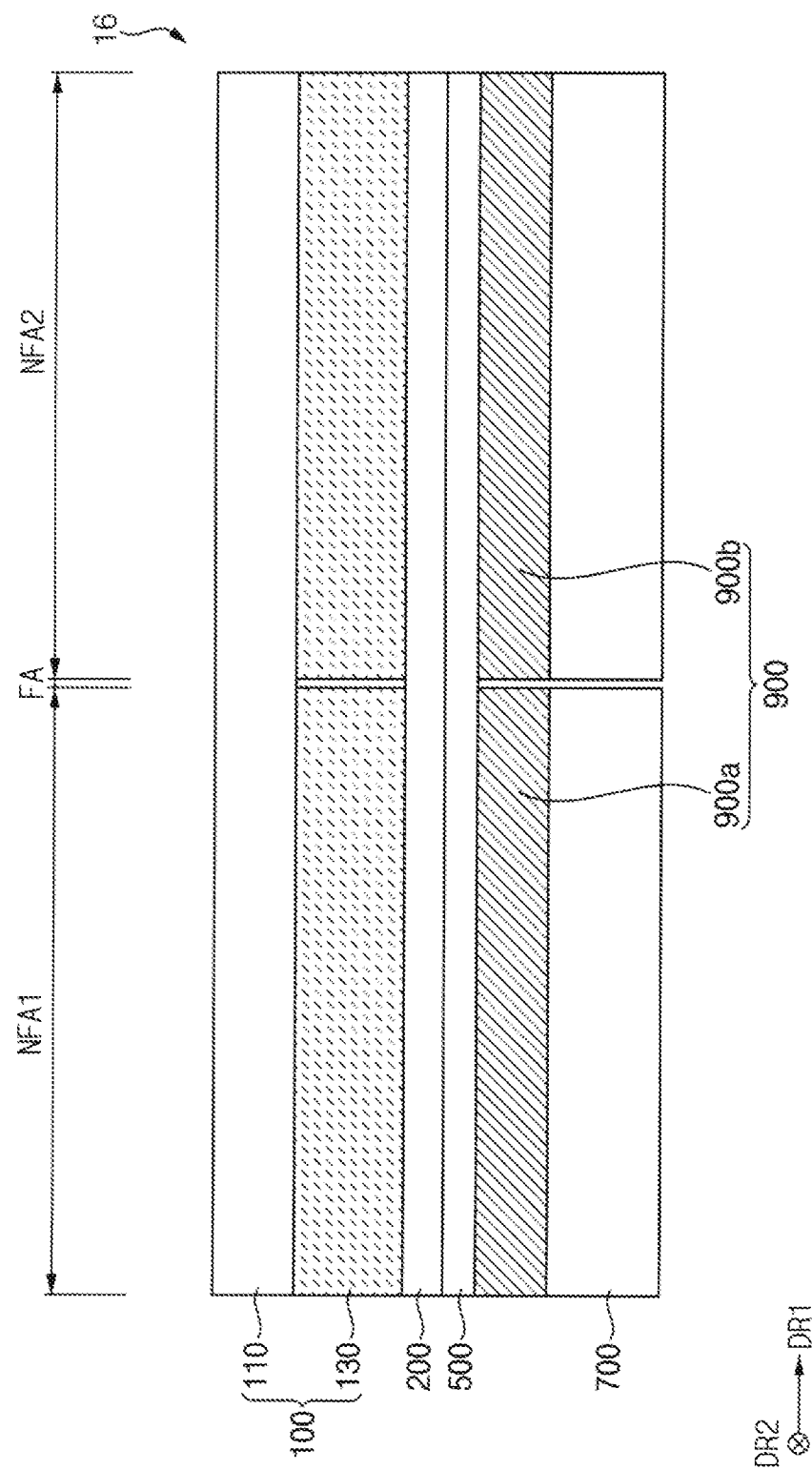

FOLDABLE DISPLAY DEVICE INCLUDING RIGID SUPPORT MEMBER

This application claims priority to Korean Patent Application No. 10-2020-0181054 filed on Dec. 22, 2020, and all the benefits accruing therefrom under 35 U.S.C. § 119, the entire disclosure of which is incorporated by reference herein.

BACKGROUND

1. Field

Embodiments relate to a display device. More particularly, embodiments relate to a foldable display device that may be folded or unfolded.

2. Description of the Related Art

A flexible display device that can be deformed into various shapes has been developed. The flexible display device, unlike a flat panel display device, may be foldable, bendable or rollable, like paper. The flexible display device may be easy to carry and improve a convenience of using the device.

A foldable display device as a flexible display device has been in a spotlight. The foldable display device may be repeatedly folded or unfolded. The foldable display device may include a display module having a flexible characteristic and a support member which is disposed on a lower surface of the display module. The support member may have a relatively large rigidity as compared to the display module, so that, deformation of the display module may be reduced or effectively prevented.

SUMMARY

A metal has been used for a material of a support member which supports a display panel within a foldable display device. However, since the metal has a relatively large weight, when the support member includes the metal, a total weight of the foldable display device relatively increases. Also, when the display device is repeatedly folded and unfolded, the metal support member is deformed permanently, so that a crease occurs in the display module. Accordingly, a display quality of the display device may be deteriorated.

Embodiments provide a display device with improved display quality.

An embodiment of a foldable display device includes a display module including a first non-folding portion, a second non-folding portion, and a first folding portion between the first non-folding portion and the second non-folding portion, a first support member on a lower surface of the display module, the first support member including a first support portion supporting the first non-folding portion, a second support portion supporting the second non-folding portion and a first opening pattern overlapping the first folding portion, and including a glass material, and a second support member under the first support member and supporting the display module.

In an embodiment, the second support member may include a second opening pattern, and the first opening pattern and the second opening pattern may each include a plurality of openings having one shape of a rectangle, a rhombus, an ellipse, a wavy shape, and a rectangle with rounded corners.

In an embodiment, a thickness of the first support member may be about 30 micrometers to about 500 micrometers.

In an embodiment, a thickness of the first support member may be greater than a thickness of the second support member.

In an embodiment, the second support member may include at least one of a metal and a glass material.

In an embodiment, the foldable display device may further include a first filler between the display module and the first support member.

In an embodiment, the first filler may be in the first opening pattern.

In an embodiment, the foldable display device may further include a second filler between the first support member and the second support member.

In an embodiment, the foldable display device may further include a lower film between the display module and the first support member.

In an embodiment, the foldable display device may further include an impact-reducing member under the second support member.

In an embodiment, the display module may further include a third non-folding portion adjacent to the second non-folding portion and a second folding portion which is between the second non-folding portion and the third non-folding portion, and the first support member may include a third support portion supporting the third non-folding portion and a third opening pattern overlapping the second folding portion.

In an embodiment, the second support member may include a fourth support portion overlapping the first support portion and a fifth support portion overlapping the second support portion, and the fourth support portion and the fifth support portion may be separated from each other.

An embodiment of a foldable display device includes a display module including a substrate including a first non-folding portion, a second non-folding portion and a folding portion between the first non-folding portion and the second non-folding portion, a first support member on a lower surface of the display module, the first support member including a first support portion supporting the first non-folding portion and a second support portion supporting the second non-folding portion and separated from the first support portion, and including a glass material, and a second support member under the first support member and supporting the display module.

In an embodiment, the second support member may include a fourth support portion overlapping the first support portion and a fifth support portion overlapping the second support portion, and the fourth support portion and the fifth support portion may be separated from each other.

In an embodiment, the second support member may include at least one of a metal material and a glass material.

An embodiment of a foldable display device includes a display module including a first non-folding portion, a second non-folding portion, folding portion between the first non-folding portion and the second non-folding portion, and a first opening pattern in the folding portion and including a glass material, and a support member under the display module, the support member including a first support portion supporting the first non-folding portion and a second support portion supporting the second non-folding portion.

In an embodiment, the display module may include a substrate, and the substrate may include a glass material.

In an embodiment, a thickness of the substrate may be about 30 micrometers to about 500 micrometers.

In an embodiment, the first support portion and the second support portion may be separated from each other.

In an embodiment, the foldable display device may further include a filler between the display module and the support member.

One or more embodiment of a display device may include a support member including a glass material. Accordingly, a weight of a foldable display device may be reduced, and a crease generated when the foldable display is folded or unfolded may decrease. Thus, a display quality of the display device may be improved.

BRIEF DESCRIPTION OF THE DRAWINGS

The above and other advantages and features of this disclosure will become more apparent by describing in further detail embodiments thereof with reference to the accompanying drawings, in which:

FIGS. 14 and 15 are cross-sectional views illustrating embodiment of a foldable display device.

DETAILED DESCRIPTION

Figure 1:
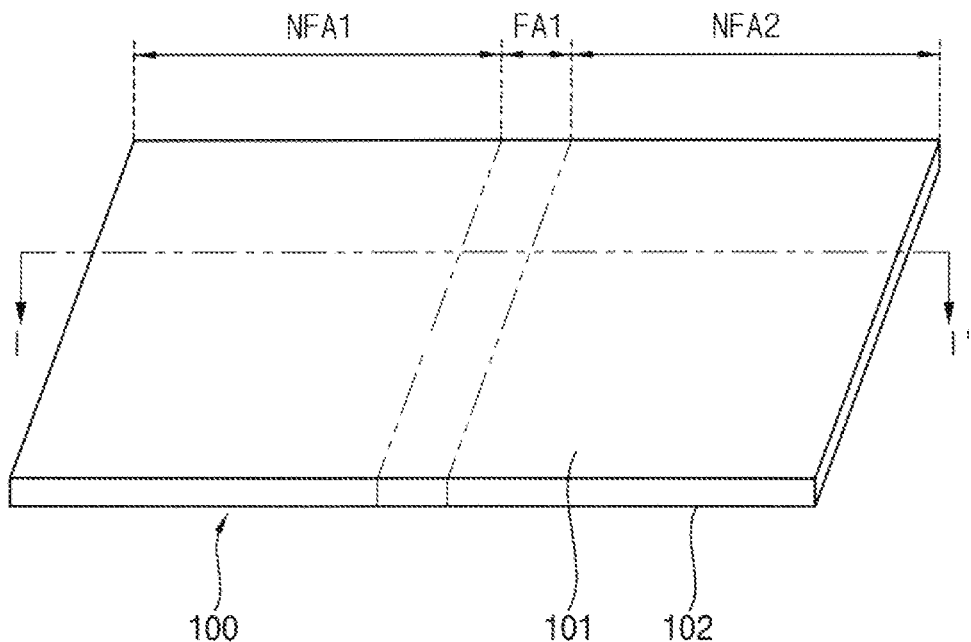
FIG. 1 is a perspective view illustrating an embodiment of a display module of a foldable display device which is unfolded.

Hereinafter, display devices in accordance with embodiments will be described in more detail with reference to the accompanying drawings. The same reference numerals are used for the same components in the drawings, and redundant descriptions of the same components will be omitted.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
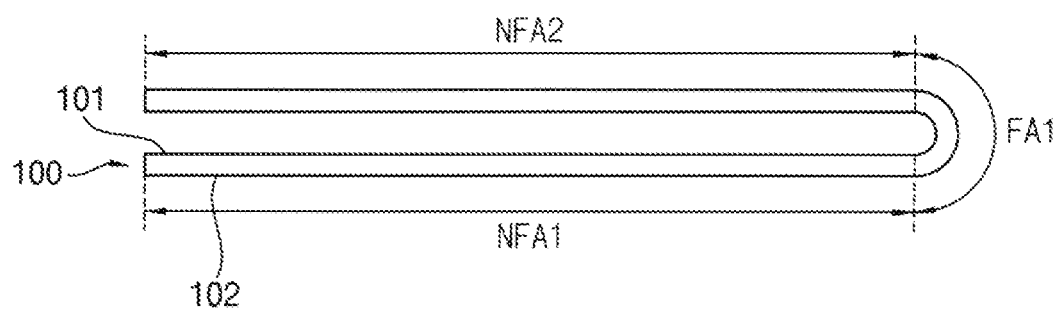
FIG. 2 is a cross-sectional view illustrating an embodiment of the display module of FIG. 1 which is folded.

FIG. 1 is a perspective view illustrating an embodiment of a display module 100 of a foldable display device 10 which is unfolded. FIG. 2 is a cross-sectional view illustrating the display module 100 of FIG. 1 which is folded.

Referring to FIGS. 1 and 2, only a display module 100 included in a foldable display device 10 is illustrated in FIGS. 1 and 2 for convenience of description.

The display module 100 may include a display surface 101 and a non-display surface 102 which is opposite to the display surface 101 (e.g., opposite surface). The display surface 101 may be a surface at which an image is displayed among surfaces of the display module 100. The non-display surface 102 may be a surface that does not display the image among surfaces of the display module 100. In an embodiment, an image may be displayed at the non-display surface 102 as well. In an embodiment, for example, an image may be displayed on a part of the non-display surface 102. Alternatively, an image may be displayed on an entirety of the non-display surface 102.

The display module 100 may have a stacked structure. In an embodiment, for example, the display module 100 may include several layers having different functions. Each of the several layers may have a flexible characteristic, and accordingly, the display module 100 may have a flexible characteristic. That is, the display module 100 and the various layers thereof may be foldable, bendable or rollable.

The display module 100 includes a first non-folding portion NFA1, a second non-folding portion NFA2, and a first folding portion FA1 disposed between the first non-folding portion NFA1 and the second non-folding portion NFA2.

The display module 100 may not be foldable at the first and second non-folding portions NFA1 and NFA2. The display module 100 may be un-foldable at the non-folding areas and may remain flat even when the display module 100 is folded at a foldable area. The display module 100 may have a flat surface in the first and second non-folding portions NFA1 and NFA2.

The display module 100 may be folded (e.g., in a folded state of FIG. 2) or unfolded (e.g., in an unfolded state of FIG. 1) at the first folding portion FA1. Also, the display module 100 may be in-folded and out-folded. In an embodiment, for example, the display module 100 may be in-folded to dispose portions of the display surface 101 facing each other (see FIG. 2). The display panel 110 may be out-folded to dispose portions of the non-display surface 102 of the display module 100 facing each other.

However, embodiments are not limited thereto, and in an embodiment, the display module 100 may further include a third non-folding portion NFA3 adjacent to the second non-folding portion NFA2. In addition, a second folding portion FA2 between the second non-folding portion NFA2 and the third non-folding portion NFA3 may be further included (see FIG. 13).

The various portions of the display module 100 may have a width along a first direction DR1. In an embodiment, a width of the first folding portion FA1 may be relatively large. Accordingly, the display module 100 may be slidable at the first folding portion FA1, and accordingly, an area (e.g., planar area as a product of dimensions along the first direction DR1 and a second direction DR2 which crosses the first direction DR1) of the display surface 101 may be adjusted.

Figure 3:
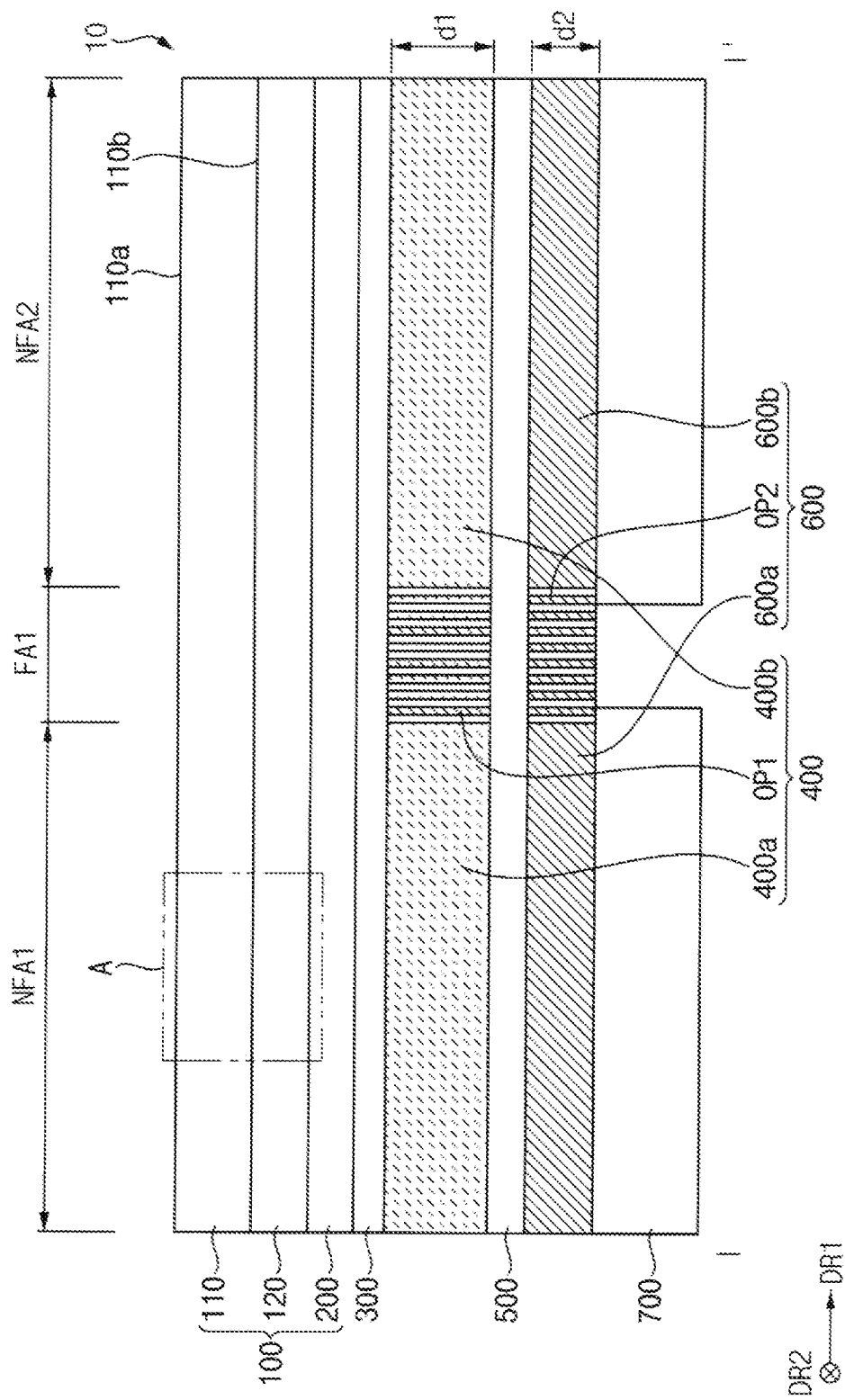
FIG. 3 is a cross-sectional view taken along line I-I' of FIG. 1.
Figure 4:
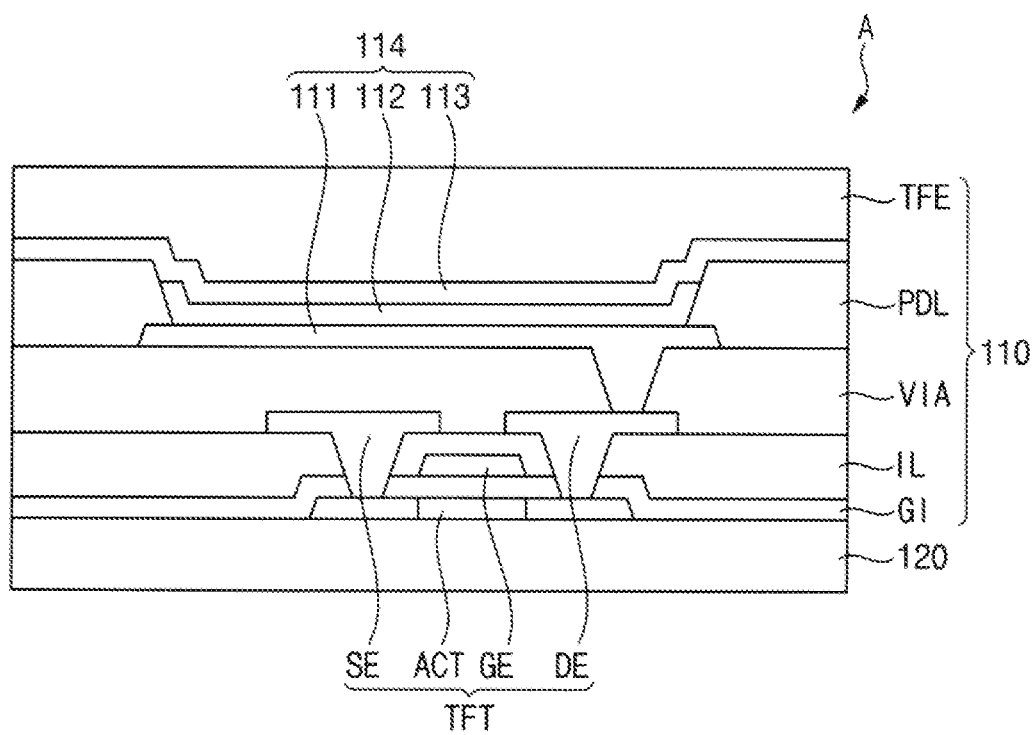
FIG. 4 is an enlarged cross-sectional view of area A of FIG. 3.

FIG. 3 is a cross-sectional view taken along line I-I' of FIG. 1. FIG. 4 is an enlarged cross-sectional view of area A of FIG. 3.

Referring to FIG. 3, the foldable display device 10 may include the display module 100, a first adhesive layer 300, a first support member 400, a second adhesive layer 500, a second support member 600, and an impact-reducing member 700. The display module 100 may include a display panel 110, a substrate 120, and a lower film 200. In addition, the display module 100 may further include a window protective layer, a window, and/or a sensing layer on the display panel 110. In an embodiment, the lower film 200 may be considered as a layer which outside the display module 100 having the display panel 110 and the substrate 120, without being limited thereto. As described above, since the display module 100 may be folded or unfolded, each of the display panel 110, the substrate 120, and the lower film 200 may have a flexible characteristic to be foldable together with each other. One or more of the substrate 120 and the lower film 200 may be a flexible layer facing the display panel 110 within the display module 100.

The display panel 110 may include a plurality of pixels, and may generate an image by combining lights emitted from each of the pixels. The display panel 110 may include a first surface 110a and a second surface 110b which are opposite to each other. The display panel 110 may display an image at the first surface 110a. The second surface 110b of the display panel 110 may be a surface at which an image is not displayed (e.g., opposite surface). The first surface 110a of the display panel 110 may define the display surface 101 of the foldable display device 10 without being limited thereto.

The lower film 200 may be disposed on a lower surface of the display panel 110. The lower film 200 may reduce or effectively prevent penetration of moisture and oxygen from outside the display module 100 and/or absorb an external impact (e.g., impact-absorbing layer).

The first adhesive layer 300 may be disposed between the lower film 200 and the first support member 400, and the second adhesive layer 500 may be disposed between the first support member 400 and the second support member 600. The first adhesive layer 300 may couple the lower film 200 and the first support member 400 to each other. The second adhesive layer 500 may couple the first support member 400 and the second support member 600 to each other.

The first support member 400 may be disposed on a lower surface of the first adhesive layer 300. The first support member 400 may support the display module 100 and/or release or dissipate heat generated from the display module 100 (e.g., heat dissipation member or layer). In addition, the first support member 400 may reduce or effectively prevent foreign substances from flowing into the display module 100 from outside thereof. The first support member 400 will be described in more detail below.

The second support member 600 may be disposed on a lower surface of the second adhesive layer 500. The second support member 600 may support the display module 100 and reduce or effectively prevent foreign substances from flowing into the display module 100. The second support member 600 will be described in more detail below.

The impact-reducing member 700 may be disposed on a lower surface of the second support member 600. The impact-reducing member 700 may protect the display panel 110 by buffering an external impact. The impact-reducing member 700 may include a first portion overlapping (or corresponding to) a first support portion 400a and a second portion overlapping (or corresponding to) a second support portion 400b. The first portion and the second portion may be separated from each other. That is, impact-reducing member 700 may be disconnected at the first folding portion FA1. The impact-reducing member 700 may include a material capable of buffering an impact such by containing air, a cushion and a sponge. In addition, the impact-reducing member 700 may include an acrylic resin, polyurethane, thermoplastic polyurethane, latex, polyurethane foam, polystyrene foam, or the like.

Referring to FIGS. 3 and 4, the display module 100 may include a lower film 200, a substrate 120, and a display panel 110. The display panel 110 may include a gate insulation layer GI, an interlayer insulation layer IL, a transistor TFT, a via insulation layer VIA, a light emitting diode 114 (e.g., light emitting element), a pixel defining layer PDL, and a thin film encapsulation layer TFE. The transistor TFT may include an active pattern ACT, a gate electrode GE, a source electrode SE, and a drain electrode DE. The light emitting diode 114 may include a pixel electrode 111, a light emitting layer 112, and a common electrode 113.

The substrate 120 may be disposed on the lower film 200. The substrate 120 may include glass, quartz, plastic, or the like. In an embodiment, for example, the substrate 120 may be a plastic substrate and may include polyimide ("PI"). In an embodiment, the substrate 120 may have a structure in which at least one polyimide layer and at least one barrier layer are alternately stacked.

A buffer layer (not shown) may be disposed on the substrate 120. The buffer layer may reduce or effectively prevent impurities from diffusing from a lower surface of the buffer layer to the active pattern ACT.

The active pattern ACT may be disposed on the buffer layer. The active pattern ACT may include a silicon semiconductor, an oxide semiconductor, or the like. The silicon semiconductor may include amorphous silicon, polycrystalline silicon, or the like. The active pattern ACT may pass an electrical current or block an electrical current according to a gate signal provided to the gate electrode GE.

The gate insulation layer GI may include an insulating material and cover the active pattern ACT. In an embodiment, for example, the gate insulation layer GI may include silicon oxide, silicon nitride, titanium oxide, tantalum oxide, or the like. The gate insulation layer GI may electrically insulate the active pattern ACT and the gate electrode GE from each other.

The gate electrode GE may include a metal, an alloy, a conductive metal oxide, or the like, and be disposed on the gate insulation layer GI. In an embodiment, for example, the gate electrode GE may include silver (Ag), an alloy containing silver, molybdenum (Mo), an alloy containing molybdenum, aluminum (Al), an alloy containing aluminum, and aluminum nitride (AlN), tungsten (W), tungsten nitride (WN), copper (Cu), nickel (Ni), chromium (Cr), chromium nitride (CrN), titanium (Ti), tantalum (Ta), platinum (Pt), The gate electrode GE may include scandium (Sc), indium tin oxide ("ITO"), indium zinc oxide ("IZO"), or the like.

The interlayer insulation layer IL may include an insulating material and may cover the gate electrode GE. In an embodiment, for example, the interlayer insulation layer IL may include silicon oxide, silicon nitride, titanium oxide, tantalum oxide, or the like. The interlayer insulation layer IL may electrically insulate the gate electrode GE from the source electrode SE, and may electrically insulate the gate electrode GE from the drain electrode DE.

The source electrode SE and the drain electrode DE may include a metal, an alloy, a conductive metal oxide, or the like, and be disposed on the interlayer insulation layer IL. In an embodiment, for example, the source and drain electrodes SE and DE may include silver (Ag), an alloy containing silver, molybdenum (Mo), an alloy containing molybdenum, aluminum (Al), and Alloy, aluminum nitride (AlN), tungsten (W), tungsten nitride (WN), copper (Cu), nickel (Ni), chromium (Cr), chromium nitride (CrN), titanium (Ti), tantalum (Ta), Platinum (Pt), scandium (Sc), indium tin oxide ("ITO"), indium zinc oxide ("IZO"), or the like.

The via insulation layer VIA may cover the source and drain electrodes SE and DE, include an organic insulating material, and have a substantially flat upper surface. In an embodiment, for example, the via insulation layer VIA may include a photoresist, a polyacrylic resin, a polyimide resin, an acrylic resin, or the like.

The pixel electrode 111 may be disposed on the via insulation layer VIA. The pixel electrode 111 may include a metal, an alloy, or a conductive metal oxide. In an embodiment, for example, the pixel electrode 111 may include silver (Ag), an alloy containing silver, molybdenum (Mo), an alloy containing molybdenum, aluminum (Al), an alloy containing aluminum, and aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), or the like. The pixel electrode 111 may receive a first voltage from the drain electrode DE.

The pixel defining layer PDL may be disposed on the via insulation layer VIA, and a pixel opening exposing an upper surface of the pixel electrode 111 may be formed (or defined) in the pixel defining layer PDL. The pixel defining layer PDL may include organic materials such as polyimide resin (for example, photosensitive polyimide resin ("PSPI")), photoresist, polyacrylic resin, and acrylic resin, or inorganic materials such as silicon oxide and silicon nitride.

The light emitting layer 112 may be disposed on the pixel electrode 111. The light emitting layer 112 may have a multilayer structure including an organic light emitting layer, a hole injection layer, a hole transport layer, an electron transport layer, an electron injection layer, or the like.

The common electrode 113 may be disposed on the light emitting layer 112 and receive a second voltage. The common electrode 113 may include a metal, an alloy, a conductive metal oxide, or the like. In an embodiment, for example, the common electrode 113 may include silver (Ag), an alloy containing silver, molybdenum (Mo), an alloy containing molybdenum, aluminum (Al), an alloy containing aluminum, and aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), or the like.

The light emitting layer 112 may generate light due to a voltage difference between the first voltage and the second voltage. Accordingly, the pixel electrode 111, the light emitting layer 112, and the common electrode 113 may together be defined as the light emitting diode 114.

The thin film encapsulation layer TFE may be disposed on the common electrode 113. The thin film encapsulation layer TFE may reduce or effectively prevent the penetration of moisture and oxygen from outside the display module 100. In an embodiment, for example, the thin film encapsulation layer TFE may have a structure in which a first inorganic layer, an organic layer, and a second inorganic layer are sequentially stacked.

Referring to FIG. 3, the first support member 400 may be disposed under the display module 100. In a thickness direction of the foldable display device 10 (e.g., a third direction crossing each of the first direction DR1 and the second direction DR2) the first support member 400 may face the display panel 110 with the substrate 120 therebetween. The first support member 400 may support the display module 100. A rigidity of the first support member 400 may be greater than a rigidity of the display module 100. Accordingly, the first support member 400 may reduce or effectively prevent deformation of the display module 100 due to an external force applied thereto. Specifically, the first support member 400 may include a first support portion 400a, a second support portion 400b, and a first opening pattern OP1. The first support portion 400a may support (or correspond to) the first non-folding portion NFA1. The second support portion 400b may support (or correspond to) the second non-folding portion NFA2. The first opening pattern OP1 may overlap (or correspond to) the first folding portion FA1. The first opening pattern OP1 may connect the first support portion 400a to the second support portion 400b. Although the first support member 400 is illustrated as a single layer in the drawing, the first support member 400 may be a multi-layer.

In an embodiment, the first support member 400 may include a glass material (e.g., first glass support member). The first support member 400 may be deformed less than that of a metal support member of a conventional display device. The metal support member of the conventional display device may be a relatively soft material. Since a ductility of the metal is greater than that of the glass material, a ductility of the metal support member of the conventional display device may be greater than that of the first support member 400. Since the ductility of the metal support member is greater than that of the first support member 400, the metal support member may be deformed more than that of the first support member 400. That is, the metal support member may be maintained in a deformed state without being recovered after the deformation occurs.

In contrast, since the first support member 400 has a small ductility, a lasting deformation of the foldable display device 10 may be reduced or prevented. Therefore, since the first support member 400 includes a glass material, a crease may not be generated in the display module 100 even if the foldable display device 10 is repeatedly folded and unfolded. In an embodiment, for example, in the case of the conventional display device including the metal support member, a depth of the crease formed at the conventional display module may be about 50 micrometers. In contrast, in one or more embodiment of the foldable display device 10 including the first support member 400, a depth of the crease formed at the display module 100 may be about 10 micrometers. That is, the crease generated in one or more embodiment of the foldable display device 10 may not be visible from outside the foldable display device 10. Accordingly, a display quality of the foldable display device 10 may be improved.

In an embodiment, since a density of the metal is greater than that of the glass material, the density of the metal support member of the conventional display device may be greater than that of the first support member 400. Therefore, when the size of the metal support member and the first support member 400 are the same, a weight of the first support member 400 may be less than a weight of the metal support member in the conventional display device. Accordingly, an overall weight of the foldable display device 10 including the first support member 400 may be reduced.

A first thickness d1 of the first support member 400 may be about 30 micrometers to about 500 micrometers. When the first thickness d1 of the first support member 400 is less than about 30 micrometers, the first support member 400 may be vulnerable to external force. In other words, since the first support member 400 includes a glass material, when the first thickness d1 of the first support member 400 is less than about 30 micrometers, the first support member 400 may be broken by an external force. When the first thickness d1 of the first support member 400 is greater than about 500 micrometers, a thickness of the foldable display device 10 may increase and a weight of the foldable display device 10 may increase.

The second support member 600 may be disposed under the first support member 400. The second support member 600 may face the display module 100 with the first support member 400 therebetween. The second support member 600 may support the display module 100. The rigidity of the second support member 600 may be greater than a rigidity of the display module 100. Accordingly, the second support member 600 may reduce or effectively prevent a deformation of the display module 100 due to an external force applied thereto. The second support member 600 may assist the first support member 400 in supporting of the display module 100. Accordingly, a durability of the foldable display device 10 may be improved by further including the second support member 600.

The second support member 600 may include at least one of a metal and a glass material. A weight of the foldable display device 10 including the second support member 600 including a glass material may be less than a weight of the foldable display device 10 including the second support member 600 including metal.

A second thickness d2 of the second support member 600 may be about 30 micrometers to about 200 micrometers. When the second thickness d2 of the second support member 600 is less than about 30 micrometers, like the first support member 400, the second support member 600 may be easily broken by an external force. In addition, when the second thickness d2 of the second support member 600 is greater than about 200 micrometers, like the first support member 400, a thickness of the foldable display device 10 may increase and a weight of the foldable display device 10 may increase.

The first thickness d1 of the first support member 400 may be greater than the second thickness d2 of the second support member 600. The first support member 400 and the second support member 600 may together support the display module 100. The second support member 600 may assist the first support member 400 to support the display module 100. When the second thickness d2 of the second support member 600 is larger than the first thickness d1 of the first support member 400, the thickness of the foldable display device 10 may increase and the weight of the foldable display device 10 may increase. Accordingly, when the first thickness d1 of the first support member 400 is larger than the second thickness d2 of the second support member 600, a durability and a portability of the foldable display device 10 may be improved.

FIGS. 5 to 8 are plan views illustrating embodiments of a first support member 400. A plan view is a view along the thickness direction, of a plane defined by the first direction DR1 and the second direction DR2 which cross each other.

Referring to FIGS. 5 to 8, the first support member 400 may include a first support portion 400a, a second support portion 400b, and a first opening pattern OP1. Patterns may not be formed in the first support portion 400a and the second support portion 400b (e.g., are excluded from the support portions). The first opening pattern OP1 may include an opening HL provided in plural including a plurality of openings HL. Each of the openings HL may have a planar shape of one of a rectangle, a rhombus, an ellipse, a wavy shape, and a rectangle with rounded corners.

The first opening pattern OP1 may be formed (or provided) by removing a part or thickness portion of the first support member 400. Specifically, a laser may be scanned at locations corresponding to each of the openings HL of the first opening pattern OP1. After, when the first support member 400 is wet etched, only a laser-scanned portion may be removed and the first opening pattern OP1 may be formed. The first opening pattern OP1 may be provided by a solid portion of the first support member 400 alternated with the opening HL.

Figure 5:
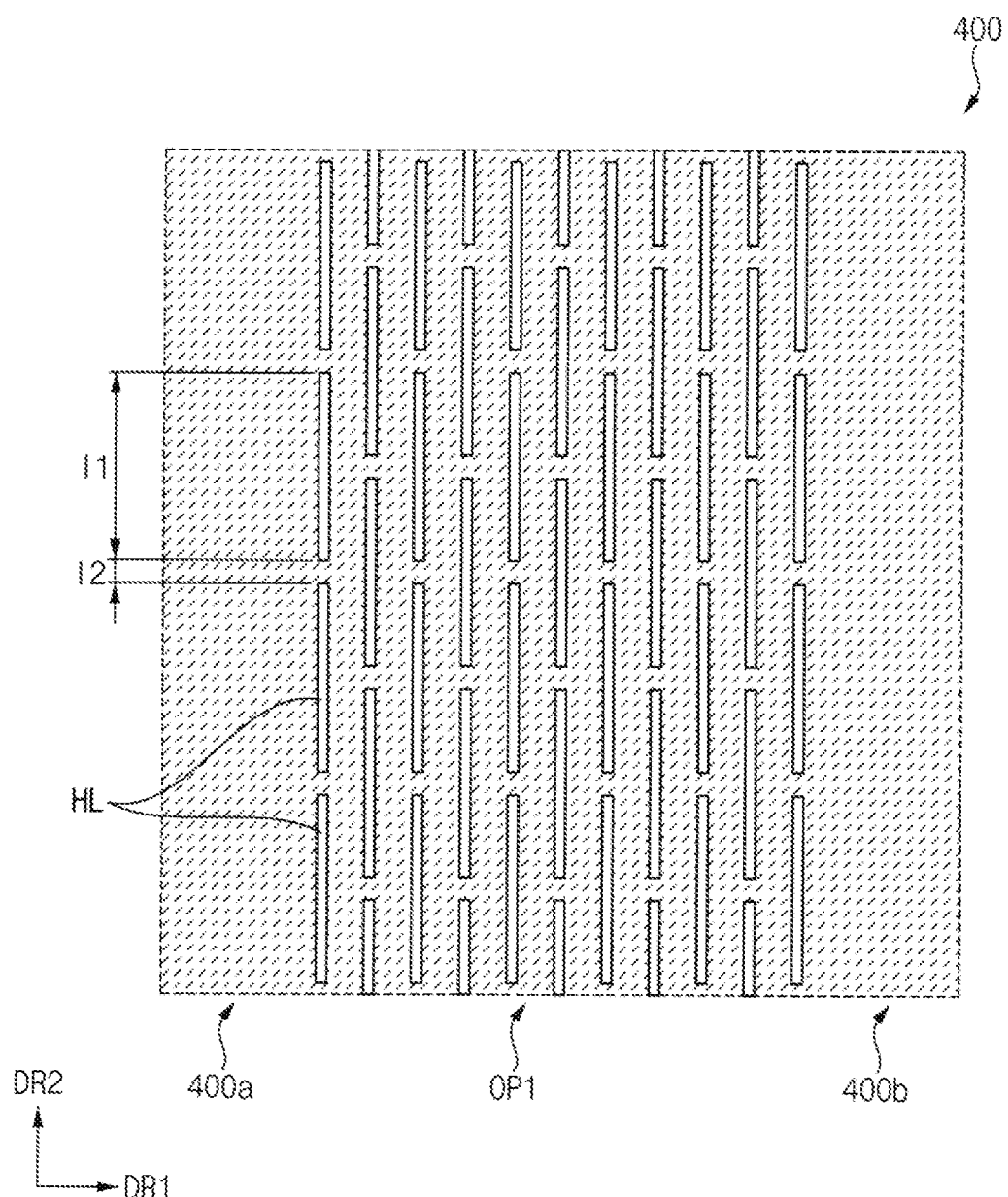
FIGS. 5 to 8 are plan views illustrating embodiments of a first support member.

Referring to FIG. 5, the first opening pattern OP1 of the first support member 400 may include the openings HL. Each of the openings HL may have a same shape. Specifically, each of the openings HL may have a same rectangular shape. Each of the openings HL may have a shape extending in the second direction DR2. That is, a long axis (or major dimension) of each of the openings HL may be parallel to the second direction DR2. The rectangular shape may have a length l1 and may be spaced apart from an adjacent rectangular shape by an interval l2 along a same line extended along the second direction DR2. The rectangular shapes arranged in a same column along the second direction DR2 may be disposed in parallel or out of position with rectangular shapes arranged in an adjacent column. The columns may be arranged along the first direction DR1.

Figure 6:
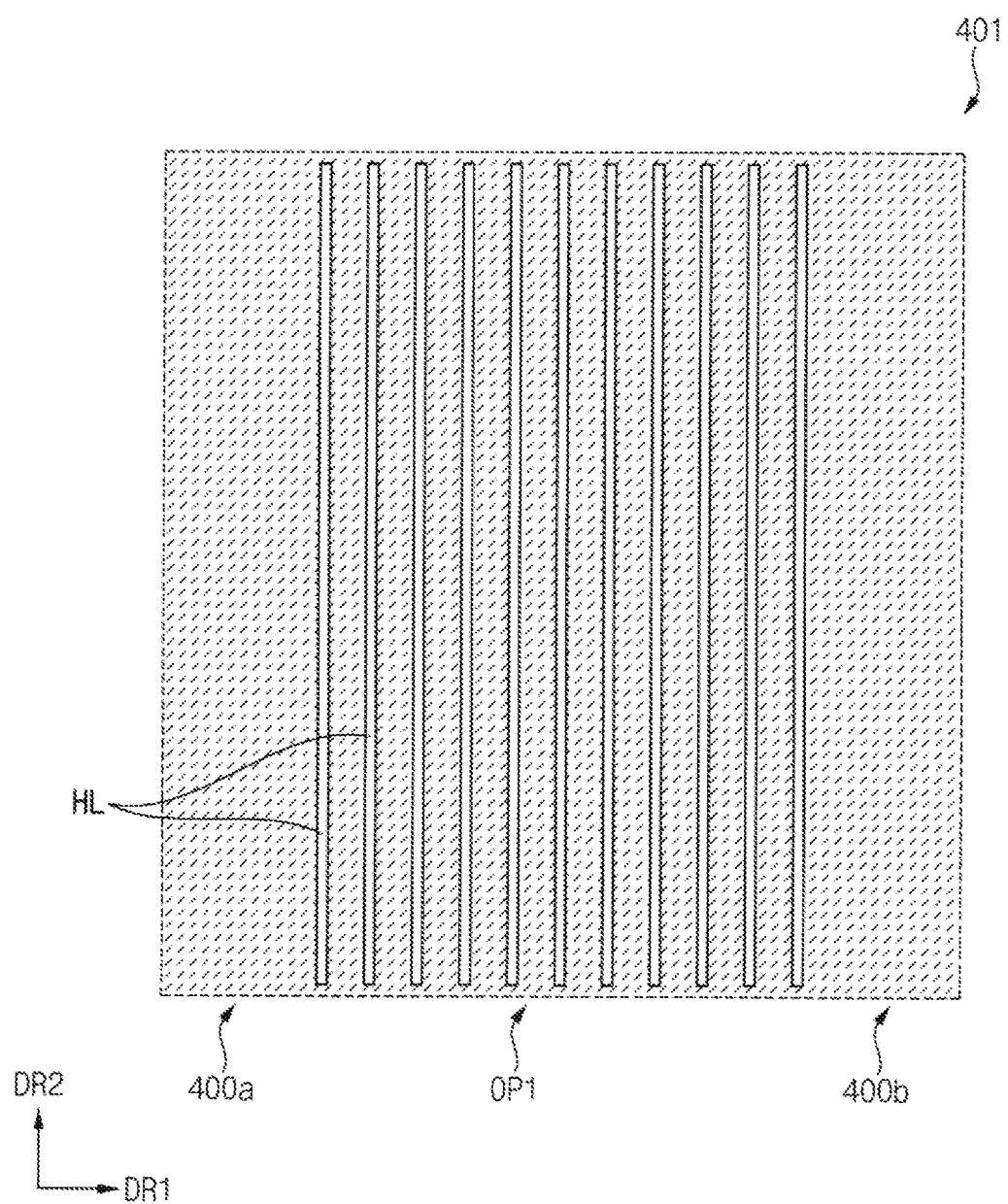

Referring to FIG. 6, the first opening pattern OP1 of a first support member 401 may include the openings HL. Each of the openings HL may have a same shape. Specifically, each of the openings HL may have a same rectangular shape, and each of the openings HL may have a shape extending in the second direction DR2. In the first opening pattern OP1 of the first support member 401, only one opening extending along the second direction DR2 may be disposed in a same column.

Figure 7:
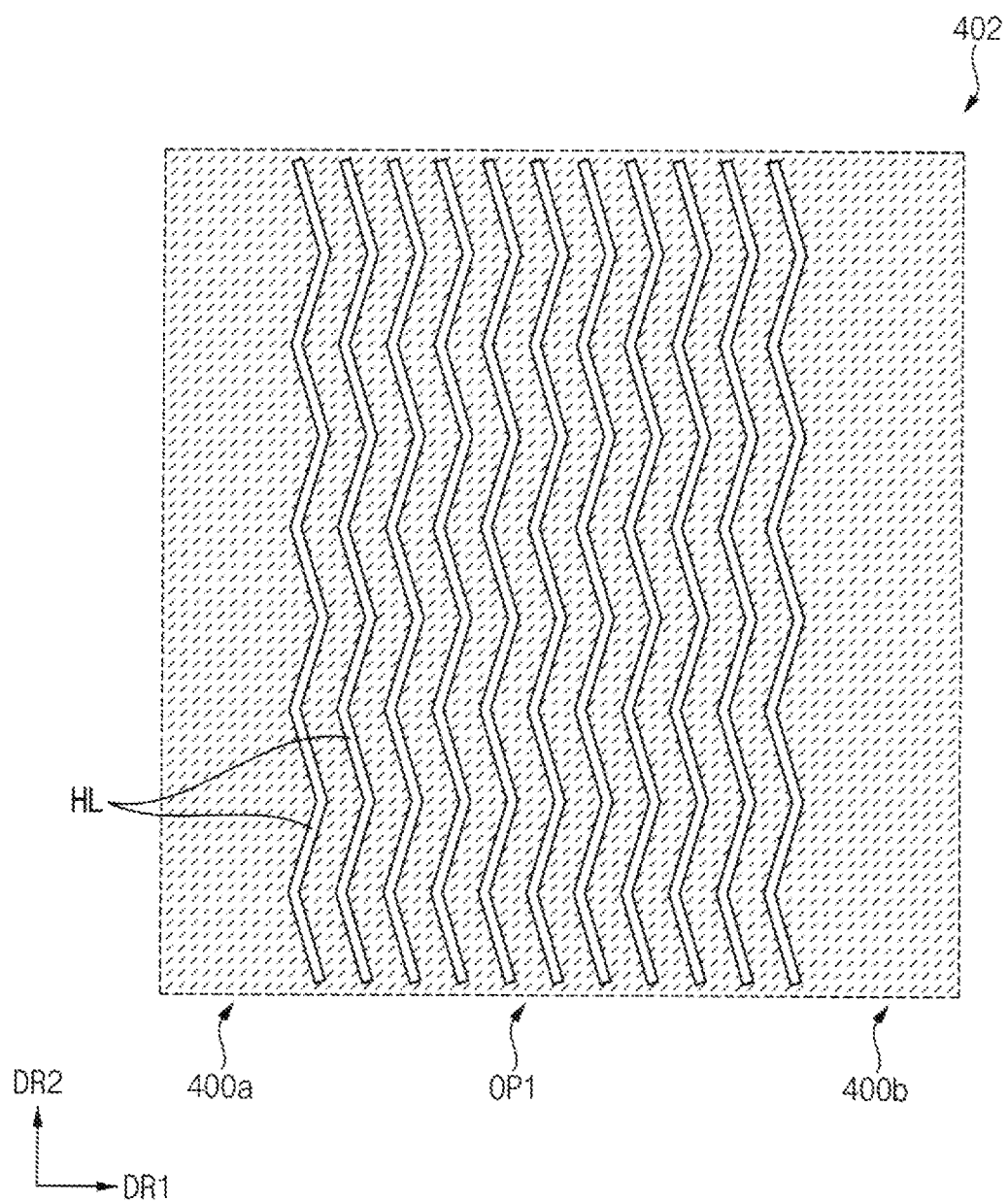

Referring to FIG. 7, the first opening pattern OP1 of the first support member 402 may include openings HL. Each of the openings HL may have a wavy shape. Only one opening extending along the second direction DR2 may be disposed in the first opening pattern OP1.

Figure 8:
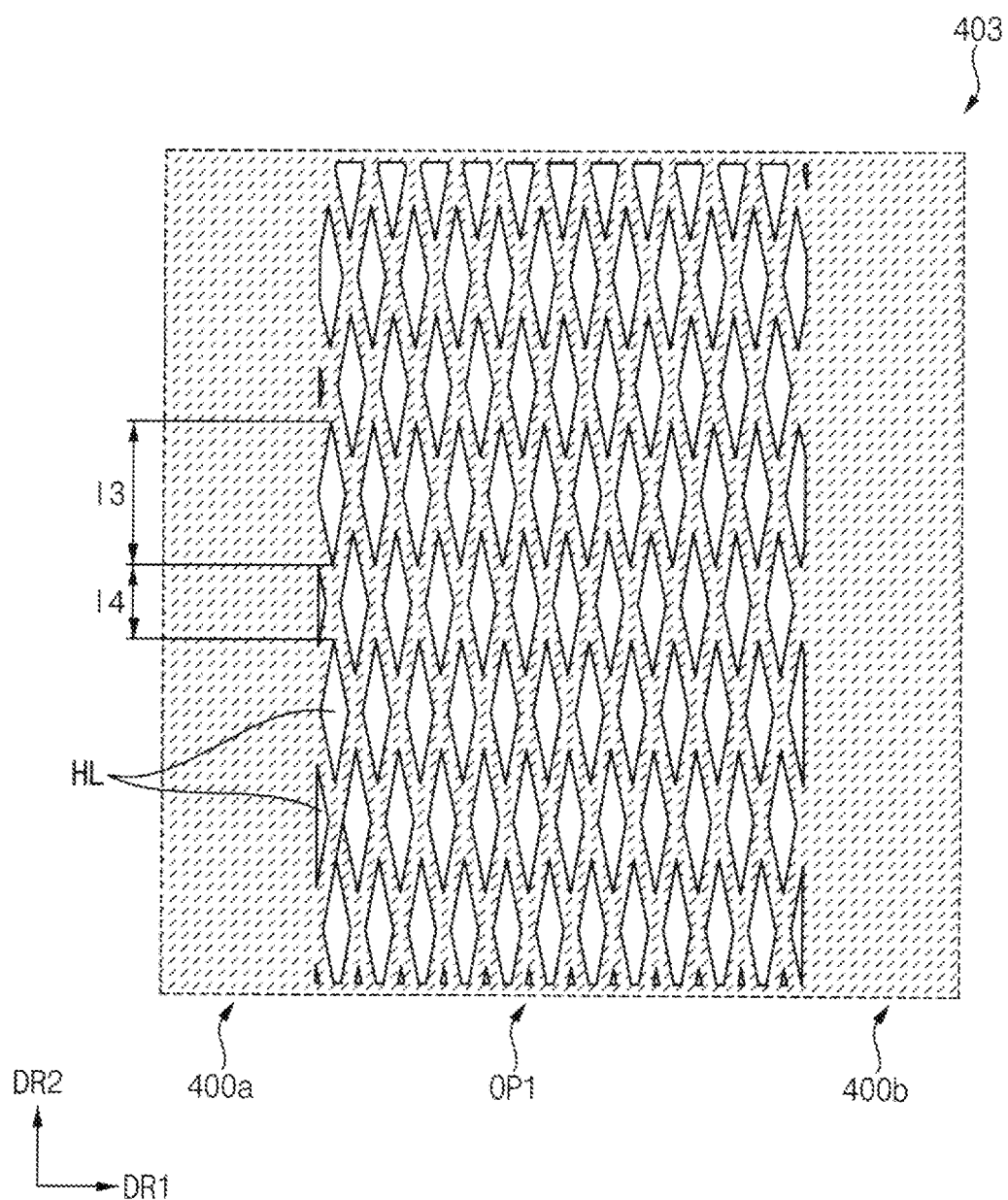

Referring to FIG. 8, the first opening pattern OP1 of a first support member 403 may include openings HL. Each of the openings HL may have a rhombus shape. The rhombus shape may have a length l3 and be spaced apart from an adjacent rhombus by an interval l4 on a same line along the second direction DR2. The rhombus shape arranged adjacent to another rhombus shape in a same column may be disposed in parallel with or out of position with the rhombus shape arranged in the adjacent column.

However, embodiments are not limited thereto, and in other embodiments, a shape or size of each of the openings HL may be different from each other. In addition, in an embodiment, the openings HL may include a rectangle with rounded corners, an ellipse, or the like in addition to the above shapes.

Referring to FIGS. 3, 5, 6, 7, and 8, the second support member 600 may include a second opening pattern OP2. The second opening pattern OP2 may include openings HL. Each of the openings HL included in the second opening pattern OP2 may have a same shape as each of the openings HL of the first opening pattern OP1. That is, each of the openings HL included in the second opening pattern OP2 may have a shape of a rectangle, a rhombus, an ellipse, a wavy shape, and a rectangle with rounded corners. The second opening pattern OP2 may connect a fourth support portion 600a to a fifth support portion 600b.

Figure 9:
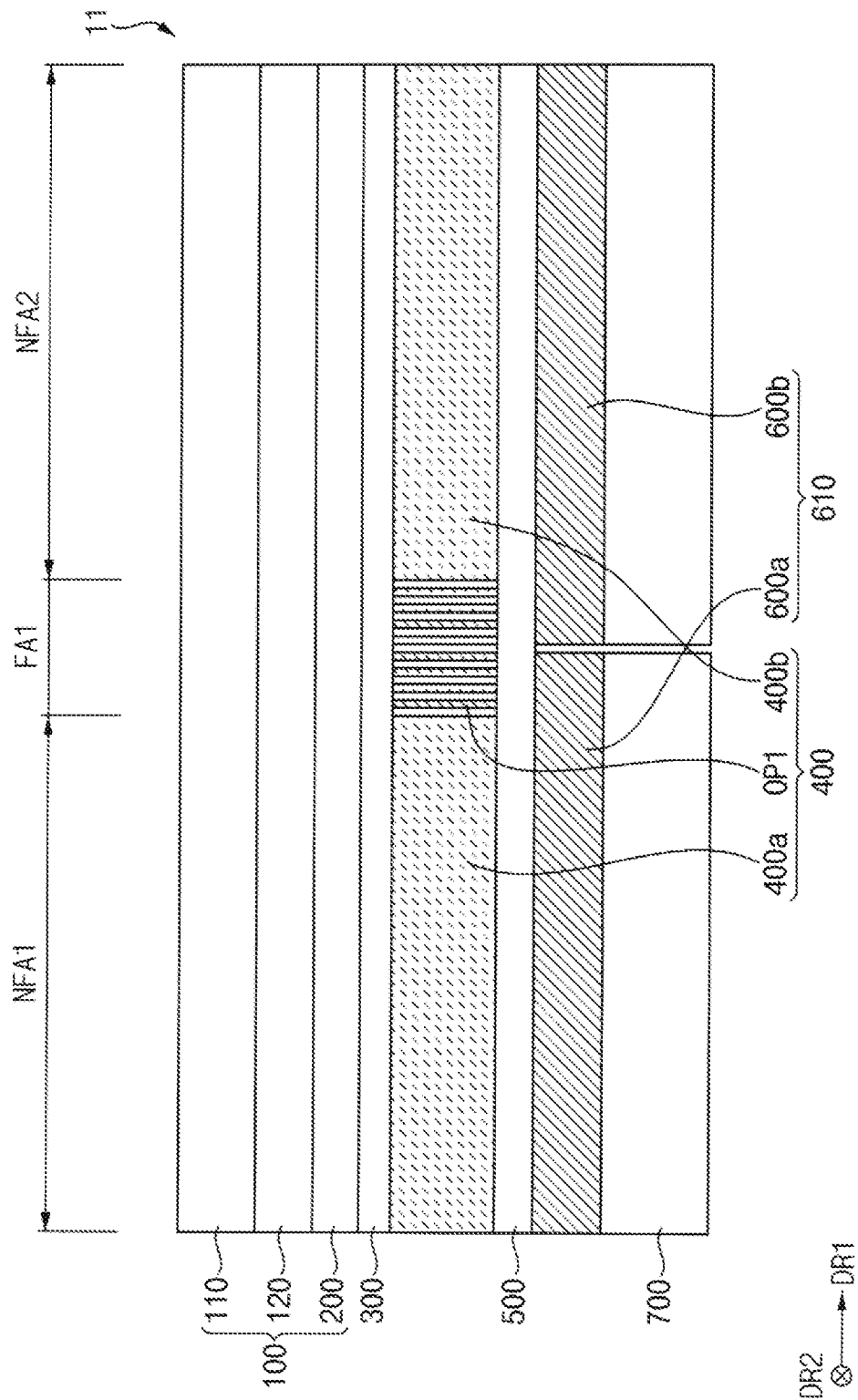
FIG. 9 is a cross-sectional view illustrating an embodiment of a foldable display device.

FIG. 9 is a cross-sectional view illustrating an embodiment of a foldable display device 11.

Referring to FIG. 9, in an embodiment, the foldable display device 11 may include a second support member 610. The second support member 610 may include a fourth support portion 600a overlapping the first support portion 400a and a fifth support portion 600b overlapping the second support portion 400b. The fourth support portion 600a and the fifth support portion 600b may be separated from each other. That is, the fourth support portion 600a and the fifth support portion 600b may be spaced apart from each other (e.g., disconnected) at the first folding portion FA1.

Figure 10:
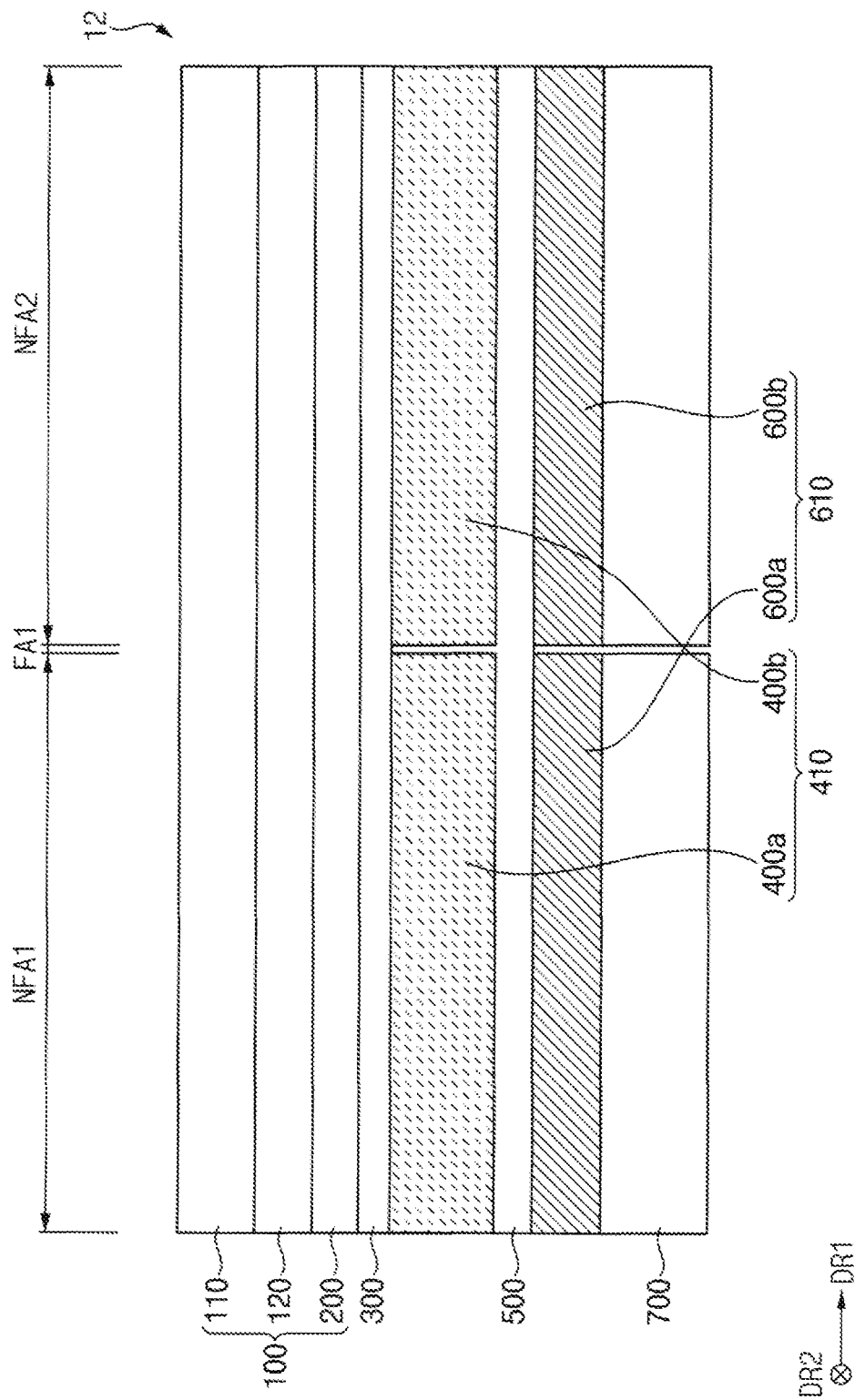
FIG. 10 is a cross-sectional view illustrating an embodiment of a foldable display device.
Figure 11:
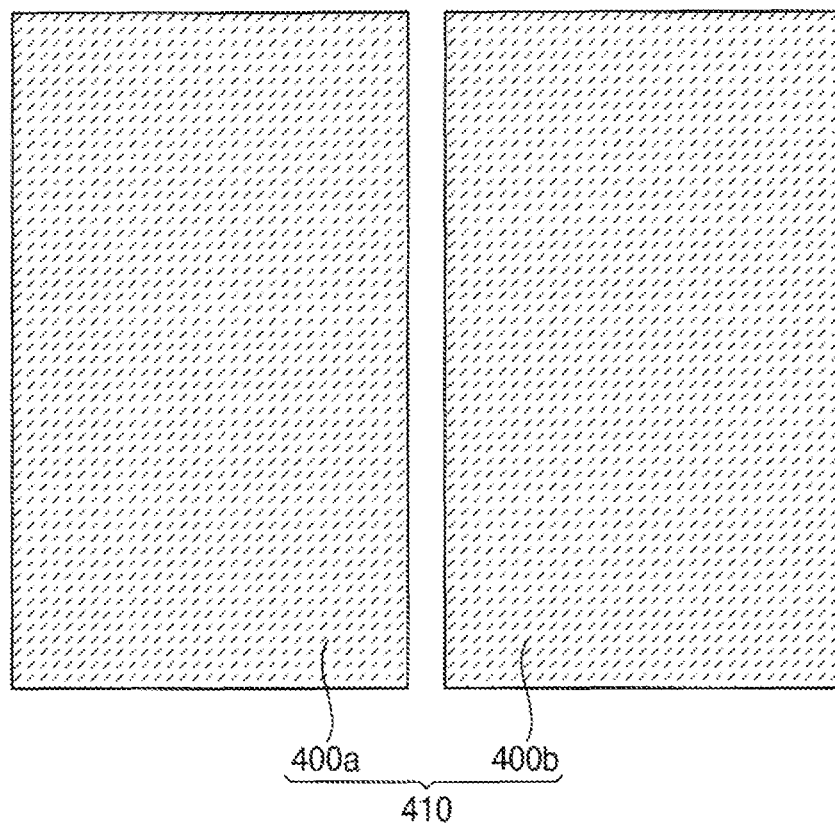
FIG. 11 is a plan view showing an embodiment of a first support member.

FIG. 10 is a cross-sectional view illustrating an embodiment of a foldable display device 12. FIG. 11 is a plan view showing an embodiment of a first support member 410.

Among configurations of a foldable display device 12 described with reference to FIGS. 10 and 11, identical to those of the foldable display device 10 described with reference to FIGS. 1 to 8 and the foldable display device 11 described with reference to FIG. 9 have been described above, and thus may be omitted below.

Referring to FIGS. 10 and 11, in an embodiment, the foldable display device 12 may include a first support member 410. The first support member 410 may include a first support portion 400a supporting the first non-folding portion NFA1 and a second support portion 400b supporting the second non-folding portion NFA2. The first support portion 400a and the second support portion 400b may be separated from each other (e.g., disconnected from each other). That is, the first support portion 400a and the second support portion 400b may be spaced apart from each other at the first folding portion FA1. When the first support portion 400a and the second support portion 400b are separated from each other, since the first support member 410 does not include the first opening pattern OP1 like FIG. 3, a permanent deformation may be reduced or effectively prevented. Accordingly, a crease may not be generated in the display module 100. The first support portion 400a and the second support portion 400b may each be a solid portion of the first support member 410, without being limited thereto.

The first support member 410 may include a glass material. The first support member 410 may be deformed less than that of a metal support member of a conventional display device. Therefore, since the first support member 410 includes a glass material, a crease may not be generated in the display module 100 even if the foldable display device 12 is repeatedly folded and unfolded.

A second support member 610 may be disposed under the first support member 410. The second support member 610 may support the display module 100. The second support member 610 may include at least one of a metal and a glass material. A weight of the foldable display device 12 including the second support member 610 including the glass material may be less than that of the foldable display device 12 including the second support member 610 including the metal.

As shown in FIG. 10, the second support member 610 may include a fourth support portion 600a overlapping the first support portion 400a and a fifth support portion 600b overlapping the second support portion 400b. The fourth support portion 600a and the fifth support portion 600b may be separated from each other. However, in an embodiment, the second support member 610 may include a second opening pattern OP2 disposed between the fourth support portion 600a and the fifth support portion 600b (see FIG. 3).

The second support member 610 may include at least one of a metal and a glass material. Since the second support member 610 of the foldable display device 12 includes the glass material, the overall weight of the foldable display device 12 may be reduced.

Figure 12:
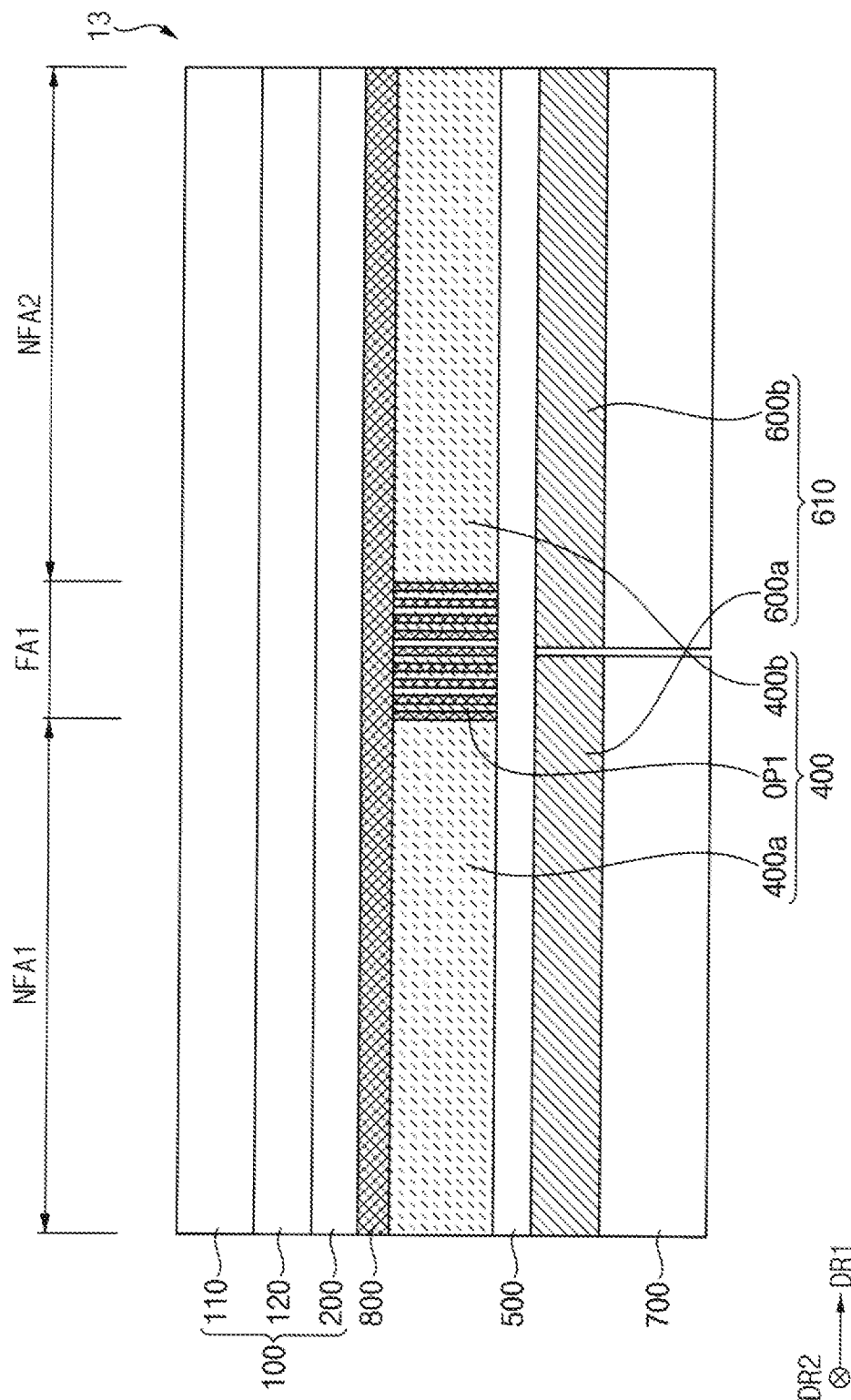
FIG. 12 is a cross-sectional view illustrating an embodiment of a foldable display device.

FIG. 12 is a cross-sectional view illustrating an embodiment of a foldable display device 13.

Referring to FIG. 12, a foldable display device 13 may further include a first filler 800 between the display module 100 and the first support member 400. That is, the display module 100 faces the first support member 400 with the first filler 800 therebetween. The first filler 800 may be outside of the first support member 400. The first filler 800 may extend into the first opening pattern OP1 from outside the first support member 400. The first filler 800 as a first elastic layer extends from between the display module 100 and the first glass support member and into the first opening pattern OP1 of the first glass support member. That is, the first filler 800 may be filled in each of the openings HL included in the first opening pattern OP1 of the first support member 400.

The first filler 800 may include a high-elastic material (e.g., first elastic layer). In an embodiment, the first filler 800 may include a polymer resin such as rubber or elastomer.

In an embodiment, an elastic modulus of the first filler 800 may be greater than an elastic modulus of the first support member 400. Since the elastic modulus of the first filler 800 is greater than the elastic modulus of the first support member 400, when a tensile stress is applied to the first opening pattern OP1 in the first direction DR1, a shape of each of the openings HL included in the first support member 400 may be changed, and the first filler 800 may contract or expand according to a change of the shape of each of the openings HL. Accordingly, a durability of the first opening pattern OP1 of the first support member 400 may be improved, and an impact resistance of the first folding portion FA1 may be strengthened. Accordingly, a durability of the foldable display device 13 may be improved.

In an embodiment, the foldable display device 13 may further include a second filler (not shown) disposed between the first support member 400 and the second support member 610 as a second elastic layer. The second filler may be disposed in addition to the second adhesive layer 500, and in an embodiment, the second filler may be disposed between the first support member 400 and the second support member 610 instead of the second adhesive layer 500. The second filler may include a same material as the first filler 800. By including the second filler, the durability of the foldable display device 13 may be improved.

Figure 13:
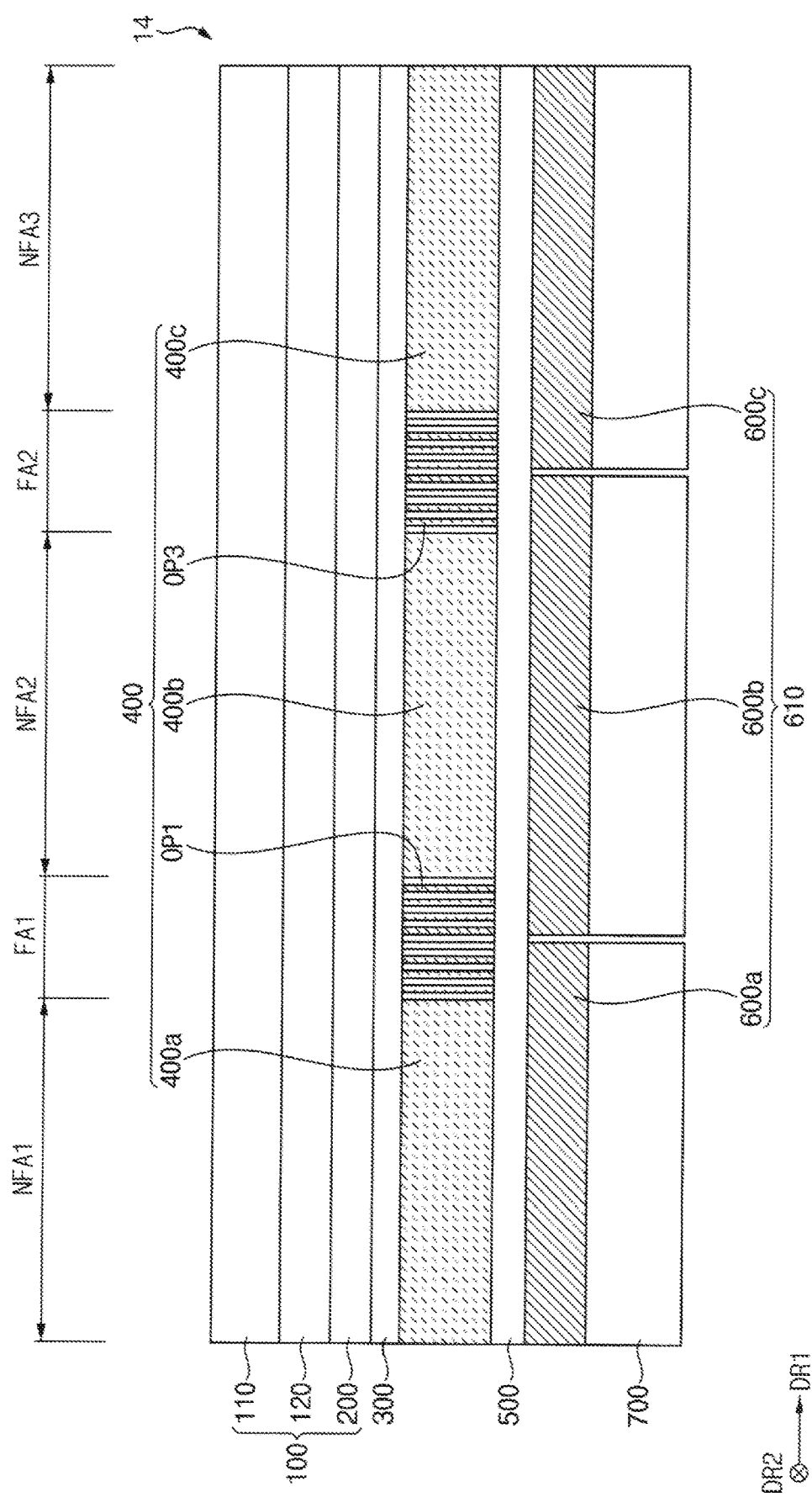
FIG. 13 is a cross-sectional view illustrating an embodiment of a foldable display device.

FIG. 13 is a cross-sectional view illustrating an embodiment of a foldable display device 14.

Referring to FIG. 13, the display module 100 of the foldable display device 14 may include a third non-folding portion NFA3 adjacent to the second non-folding portion NFA2 along the first direction DR1. That is, the first non-folding portion NFA1, the second non-folding portion NFA2 and the third non-folding portion NFA3 may be arranged in order along the first direction DR1. That is, the third non-folding portion NFA3 may be adjacent to the second non-folding portion NFA2 in the first direction DR1 and may be spaced apart from the first non-folding portion NFA1. In addition, the display module 100 may further include a second folding portion FA2 between the second non-folding portion NFA2 and the third non-folding portion NFA3. The display module 100 may be folded and unfolded at the second folding portion FA2. The first support member 400 may include a third opening pattern OP3 overlapping the second folding portion FA2. Each of the openings HL included in the third opening pattern OP3 may have a shape of one of a rectangle, a rhombus, an ellipse, a wavy shape, and a rectangle with rounded corners. The second support member 610 may further include a sixth support portion 600c overlapping the third support portion 400c.

In other embodiment, the display module 100 of the foldable display device 14 may include two or more folding portions. Accordingly, the display module 100 may be folded or unfolded at each of the two or more folding portions.

Figure 14:
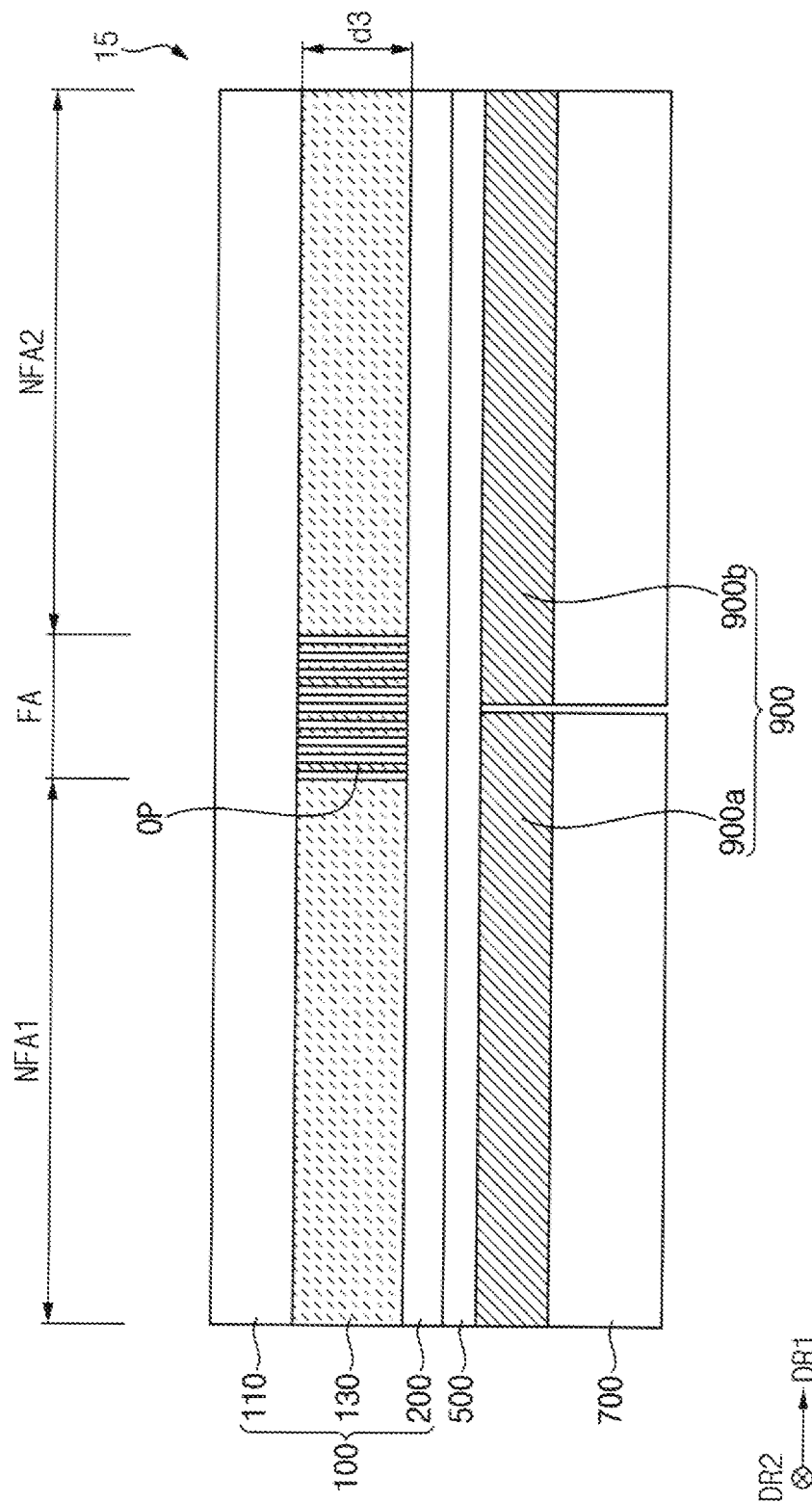

FIGS. 14 and 15 are cross-sectional views illustrating embodiments of foldable display devices 15 and 16, respectively.

Among configurations of foldable display devices 15 and 16 described with reference to FIGS. 14 and 15, identical to those of the foldable display device 10 described with reference to FIGS. 1 to 8 have been described above, and thus may be omitted below.

Referring to FIG. 14, the foldable display device 15 may include a display module 100, a lower film 200, a second adhesive layer 500 (e.g., adhesive layer), and a support member 900. The display module 100 may include a support substrate 130, a lower film 200, and a display panel 110. The lower film 200 may face the display panel 110 with the support substrate 130 therebetween.

The display module 100 may include a first non-folding portion NFA1, a second non-folding portion NFA2, and a folding portion FA positioned between the first non-folding portion NFA1 and the second non-folding portion NFA2. The display module 100 may be folded and unfolded at the folding portion FA. The support substrate 130 included in the display module 100 may include an opening pattern OP overlapping the folding portion FA. Each of the openings HL included in the opening pattern OP may have a shape of one of a rectangle, a rhombus, an ellipse, a wavy shape, and a rectangle with rounded corners. However, in other embodiment, the support substrate 130 may not include the opening pattern OP, and the first non-folding portion NFA1 and the second non-folding portion NFA2 may be separated (e.g., disconnected) from each other.

In an embodiment, the support substrate 130 may include a glass material. That is, the support substrate 130 may be a glass substrate. A conventional substrate of a conventional display device may be a plastic substrate and may include polyimide ("PI"). In one or more embodiments, the support substrate 130 (e.g., non-plastic substrate) may be deformed less than that of the conventional plastic substrate of the conventional display device. Since a ductility of a plastic is greater than that of the glass material, a ductility of the conventional plastic substrate may be greater than that of the glass support substrate 130. Since the ductility of the conventional plastic substrate is greater than that of the glass support substrate 130, the conventional plastic substrate may be deformed more than that of the glass support substrate 130. That is, the conventional plastic substrate may be maintained in a deformed state without being recovered after the deformation occurs. Accordingly, the impact resistance of the display module 100 may be improved.

Further referring to FIG. 3, in the case of the glass support substrate 130, the glass support substrate 130 may serve a function of the first support member 400 of FIG. 3. Accordingly, the first support member 400 may be omitted from the foldable display device 15. That is, only one support layer outside of the display module 100 (e.g., the support member 900) may be disposed in the foldable display device 15. Accordingly, an overall thickness of the foldable display device 15 may be reduced, and a portability of the foldable display device 15 may be improved.

A third thickness d3 of the support substrate 130 may be about 30 micrometers to about 500 micrometers. When the thickness d3 of the support substrate 130 is less than about 30 micrometers, the support substrate 130 may be vulnerable to an external force. In other words, since the support substrate 130 includes a glass material, when the third thickness d3 of the support substrate 130 is less than about 30 micrometers, the support substrate 130 may be broken by the external force. When the third thickness d3 of the support substrate 130 is more than about 500 micrometers, the thickness of the foldable display device 15 may increase and the overall weight of the foldable display device 15 may increase.

The second adhesive layer 500 may be disposed between the lower film 200 and the support member 900. The second adhesive layer 500 may couple the lower film 200 and the support member 900.

The support member 900 may support the display module 100. A rigidity of the support member 900 may be greater than a rigidity of the display module 100. Accordingly, the support member 900 may reduce or effectively prevent deformation of the display module 100 due to an external force applied thereto. In an embodiment, for example, the support member 900 faces the display module 100 along a thickness direction, the glass substrate within the display module 100 (e.g., the support substrate 130) has a thickness along the thickness direction (e.g., third thickness d3), and the thickness of the glass substrate within the display module 100 is about 30 micrometers to about 500 micrometers.

The support member 900 may be disposed under the display module 100. The support member 900 may include a first support portion 900a supporting the first non-folding portion NFA1 and a second support portion 900b supporting the second non-folding portion NFA2. The first support portion 900a and the second support portion 900b may be separated from each other (see FIG. 11). However, in embodiment, the first support portion 900a and the second support portion 900b may not be separated, and the support member 900 further may further include an opening pattern OP between the first support portion 900a and the second support portion 900b (see FIG. 5).

In an embodiment, the foldable display device 15 may further include a filler between the display module 100 and the support member 900 (see FIG. 12) as an elastic layer. The filler may be filled in each of the openings HL included in the opening pattern OP of the support member 900. Accordingly, a durability of the opening pattern OP of the support member 900 may be improved, and an impact resistance of the folding portion FA may be strengthened. Accordingly, a durability of the foldable display device 15 may be improved.

Referring to FIG. 15, in an embodiment, the foldable display device 16 may include a support substrate 130 made of a glass material. The first non-folding portion NFA1 and the second non-folding portion NFA2 included in the support substrate 130 may be separated from each other. Accordingly, a crease generated in the display module 100 may be reduced or effectively prevented and a display quality of the foldable display device 16 may be improved.

One or more embodiment of the display device may be applied to a display device included in a computer, a notebook, a mobile phone, a smartphone, a smart pad, a personal media player ("PMP"), a personal digital assistant ("PDA"), an MP3 player, or the like.

What is claimed is:

1. A foldable display device comprising:
    a plurality of glass layers;
    a display module including a first non-folding portion, a second non-folding portion, and a first folding portion between the first non-folding portion and the second non-folding portion;
    a first glass support member among the plurality of glass layers, the first glass support member facing the display module and including a first support portion corresponding to the first non-folding portion, a second support portion corresponding to the second non-folding portion, and a plurality of first openings corresponding to the first folding portion; and
    a second glass support member among the plurality of glass layers, the second glass support member facing both the first non-folding portion and the second non-folding portion of the display module with the first glass support member therebetween.

2. The foldable display device of claim 1, wherein
    the second glass support member includes a plurality of second openings corresponding to the first folding portion of the display module,
    each of the plurality of first openings and the plurality of second openings having a rectangle shape, a rhombus shape, an ellipse shape, a wavy shape and a rectangle shape with rounded corners.

3. The foldable display device of claim 1, wherein
    the second glass support member faces both the first non-folding portion and the second non-folding portion of the display module along a thickness direction,
    the first glass support member has a thickness along the thickness direction, and
    the thickness of the first glass support member is about 30 micrometers to about 500 micrometers.

4. The foldable display device of claim 1, wherein
    the second glass support member faces both the first non-folding portion and the second non-folding portion of the display module along a thickness direction,
    each of the first glass support member and the second glass support member has a thickness along the thickness direction, and
    the thickness of the first glass support member is greater than the thickness of the second glass support member.

5. The foldable display device of claim 1, wherein the display module includes a substrate including a plastic substrate, the substrate facing the second glass support member with the first glass support member therebetween.

6. The foldable display device of claim 1, further comprising a first elastic layer between the display module and the first glass support member.

7. The foldable display device of claim 6, wherein the first elastic layer extends from between the display module and the first glass support member and into the plurality of first openings of the first glass support member.

8. The foldable display device of claim 6, further comprising a second elastic layer between the first glass support member and the second glass support member.

9. The foldable display device of claim 1, further comprising a flexible layer between the display module and the first glass support member.

10. The foldable display device of claim 1, further comprising an impact-reducing member facing the first glass support member with the second glass support member therebetween.

11. The foldable display device of claim 1, wherein
the display module further includes a third non-folding portion adjacent to the second non-folding portion and a second folding portion which is between the second non-folding portion and the third non-folding portion, and
the first glass support member further includes a third support portion corresponding to the third non-folding portion of the display module and a plurality of third openings corresponding to the second folding portion of the display module.

12. The foldable display device of claim 1, wherein
the second glass support member includes a fourth support portion corresponding to the first support portion of the first glass support member and a fifth support portion corresponding to the second support portion of the first glass support member, and
the fourth support portion and the fifth support portion are disconnected from each other at the first folding portion of the display module.

13. A foldable display device comprising:
a display module including a first non-folding portion, a second non-folding portion, a folding portion between the first non-folding portion and the second non-folding portion, and a glass substrate facing the first non-folding portion and the second non-folding portion and defining a first opening pattern in the folding portion; and
a support member which faces the first opening pattern of the display module, the support member including a first support portion corresponding to the first non-folding portion of the display module and a second support portion corresponding to the second non-folding portion of the display module.

14. The foldable display device of claim 13, wherein the support member is a glass support member.

15. The foldable display device of claim 13, wherein
the support member faces the display module along a thickness direction,
the glass substrate within the display module has a thickness along the thickness direction, and
the thickness of the glass substrate within the display module is about 30 micrometers to about 500 micrometers.

16. The foldable display device of claim 13, wherein the first support portion and the second support portion of the support member are disconnected from each other at the folding portion of the display module.

17. The foldable display device of claim 13, further comprising an elastic layer between the display module and the support member.

* * * * *